United States Patent [19]
Walden

[11] Patent Number: 5,896,044
[45] Date of Patent: Apr. 20, 1999

[54] UNIVERSAL LOGIC LEVEL SHIFTING CIRCUIT AND METHOD

[75] Inventor: Robert William Walden, Bethlehem, Pa.

[73] Assignee: Lucent Technologies, Inc., Murray Hill, N.J.

[21] Appl. No.: 08/987,010

[22] Filed: Dec. 8, 1997

[51] Int. Cl.$^6$ .............................................. H03K 19/0175

[52] U.S. Cl. ............................. 326/80; 326/81; 326/68

[58] Field of Search ............................... 326/80, 81, 68, 326/83, 121

[56] References Cited

U.S. PATENT DOCUMENTS

| | | |
|---|---|---|
| 4,704,547 | 11/1987 | Kirsh . |
| 4,958,091 | 9/1990 | Roberts . |
| 5,321,324 | 6/1994 | Hardee et al. . |
| 5,479,116 | 12/1995 | Sallaerts et al. ........................ 326/80 |
| 5,583,454 | 12/1996 | Hawkins et al. ........................ 326/81 |
| 5,668,483 | 9/1997 | Roohparvar ............................ 326/34 |

*Primary Examiner*—Michael Tokar
*Assistant Examiner*—Daniel D. Chang

[57] ABSTRACT

A level shifter circuit which is suitable for use in an integrated circuit converts an input logic signal having a first voltage potential to an output logic signal having a second voltage potential. For logic signals transmitted between sections of an integrated circuit operating with different supply voltages, the level shifter circuit allows reliable circuit operation between the sections when the voltage potential of the input logic signal is converted to the output logic signal having a higher voltage potential, the same voltage potential, or a lower voltage potential. The level shift circuit includes an inverter stage which drives a fully differential output stage, and the fully differential output stage includes two sections. Each section incorporates a fast switching pair of transistors connected in series across an output supply voltage and ground potential which act as an inverter and which provide an output node at the series connection. For a section, the series-connected transistor between the output supply voltage and the output node is also connected in parallel with a voltage pull-up transistor having its gate controlled by the signal provided at the output node of the other section. The first section is controlled by the input logic signal provided to the gate of the series-connected transistor between its output node and the ground potential and the inverted input logic signal provided to the gate of the series-connected transistor between its output node and the output supply voltage. Similarly, the second section is controlled by the inverted input logic signal provided to the gate of the series-connected transistor between its output node and the ground potential and the input logic signal provided to the gate of the series-connected transistor between its output node and the output supply voltage.

13 Claims, 6 Drawing Sheets

UNIVERSAL LOGIC LEVEL SHIFTING CIRCUIT AND METHOD

FIELD OF THE INVENTION

The present invention relates in general to translating voltage levels between circuits, and, more particularly, to improvements in a level shifting circuit which translates logic signals between two different voltage levels.

BACKGROUND OF THE INVENTION

Current integrated circuits (ICs), such as digital signal processor (DSP) based superchips, often contain many circuits, including both digital logic circuits as well as analog circuits, which may operate with different power supply constraints. For example, a DSP engine of an IC may operate between different logic level voltages than memory, input/output interfaces, or other digital signal processing sections. Also, for some digital circuits it may be desirable to select DSP supply voltage to optimize performance for specific applications or operating conditions. For example, one might increase supply voltage to increase DSP processing rate, or in other situations reduce supply voltage to conserve power when less processing capability is required. To accommodate various power supply combinations, logic level shifters are required to couple signals reliably between the circuits with different supplies. Such a circuit is described, for example, in U.S. Pat. No. 5,272,389 to A. Hatada.

For a case where logic levels are translated from a low supply voltage (VDDL) to a high supply voltage (VDDH) and in circuits which share a common ground level (VSS), without a level shifting circuit (a "level shifter") a logic high from the VDDL side may drive a gate on the VDDH side to a mid-range voltage, resulting in an indeterminate logic state and high current consumption. Another problem encountered for such a case may be increasing switching speed while preventing latch-up during power-up of the circuit. For this case where the circuit translates from a low to high voltages, a comparator may be used with transistors to limit voltages at some circuit nodes while also limiting the voltage across transistors during switching to improve reliability. Such a circuit is described, for example, in U.S. Pat. No. 5,321,324 to Hardee et al.

For a case where logic levels are translated from a high supply voltage to a lower voltage, special logic level conversion circuits may not be required, if both circuits share a common ground potential. For this case, the logic-high output from the high-voltage circuit should also be more than sufficient to drive the low-voltage gate to saturation.

However, for a more general case where one supply may be either higher or lower than the other, level shifters are required which work well under a combination of conditions. An example of this situation might be a DSP superchip for which the analog sections require a 2.7 volt supply, while the DSP may be operated at any voltage from 1.8 to 5 volts. For clock or data-path signals, it is usually important that the level shifter maintain reasonable balance between rise and fall delays and that delays be relatively short. Timing requirements for control signals are usually less stringent, but reliability is still paramount. However, many level conversion circuits employ complex biasing of the transistor stages to accomplish reliable operation, such as the circuit described in U.S. Pat. No. 5,479,116 to Sallaerts et al., with the disadvantages of increased complexity and increased use of valuable IC real estate.

Therefore, there is a need for a level conversion circuit which translates from a low voltage to a high voltage as well as translating from the high voltage to the low voltage. In addition, the level conversion circuit configuration should be simple and require minimal biasing for reliable operation.

SUMMARY OF THE INVENTION

The present invention relates to an integrated circuit which includes a level shifting circuit for converting an input signal varying between a first voltage level and a reference voltage and an output signal varying between a second voltage level and the reference voltage. The level shifting circuit includes (1) an inverter stage coupled across the first voltage level and the reference voltage that receives at its input terminal the input signal and provides at an inverter output terminal an inverted input signal, and (2) a differential stage including first and second sections. Each section of the differential stage has a first and a second transistor coupled in series between the second voltage level and the reference voltage, the first transistor coupled in parallel with a third transistor and the first, second and third transistor being coupled to a respective output node. The first and second transistors of the first section are respectively coupled to the inverter output terminal and input terminal to respectively receive the inverted input signal and the input signal, the first and second transistors of the second section are respectively coupled to the inverter input terminal and output terminal to respectively receive the input signal and the inverted input signal, and the third transistor of each section is coupled to the output node of the second and first section. The third transistor of the second section, responsive to a signal at the output node of the first section, drives the first and second transistor of the second section so as to provide the output signal varying between the second voltage level and the reference voltage at the output node of the second section.

BRIEF DESCRIPTION OF THE DRAWINGS

The aforementioned features and benefits of the invention will be better understood from a consideration of the detailed description which follows taken in conjunction with the accompanying drawings, in which.

DETAILED DESCRIPTION

Figure 1:
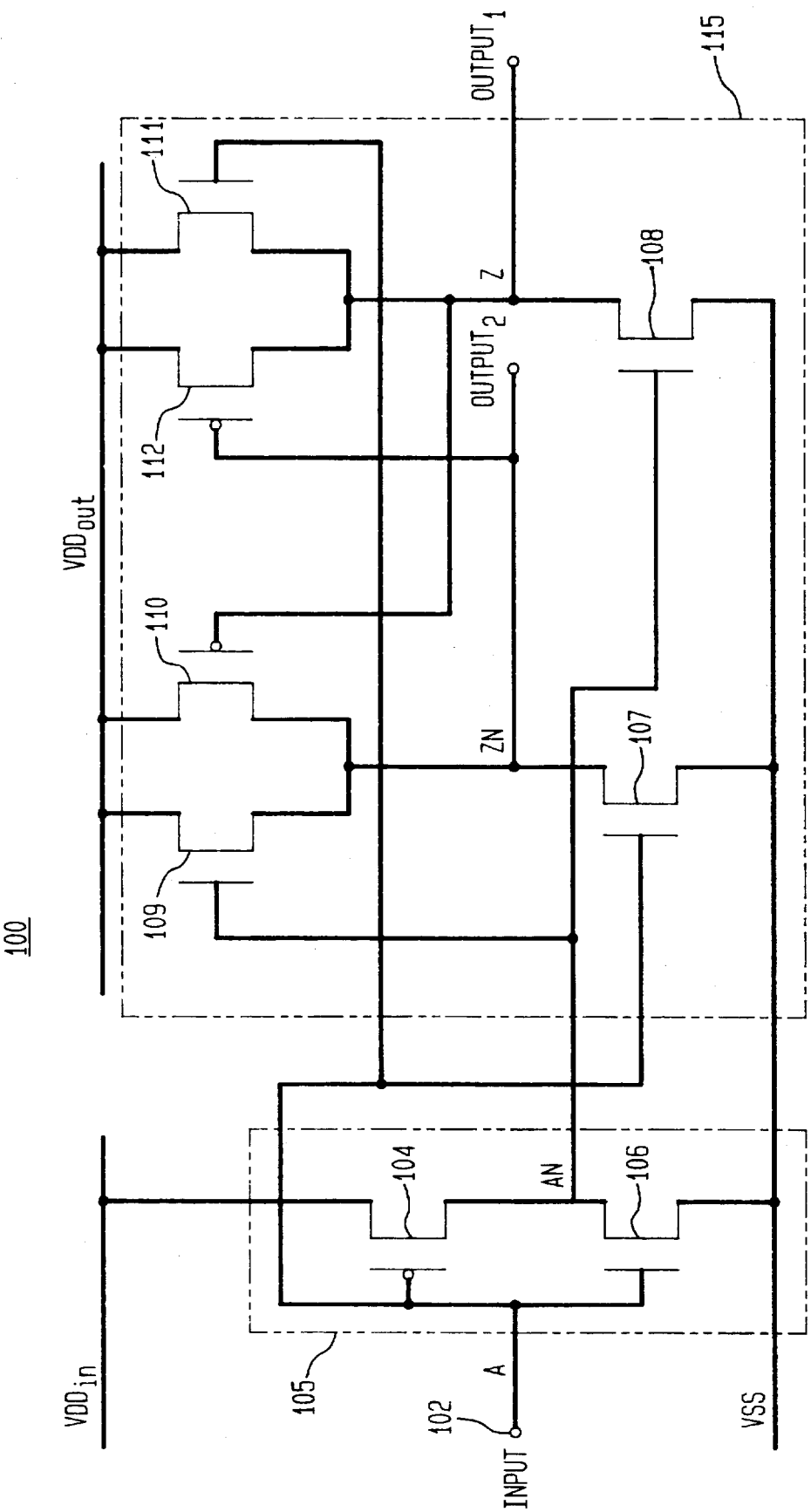
FIG. 1 is a circuit diagram illustrating an exemplary embodiment of the present invention.

FIG. 1 is a circuit diagram illustrating an exemplary embodiment of the present invention. As shown in FIG. 1, level shifter circuit 100 consists of an input inverter stage 105 connected between a first voltage $VDD_{IN}$ and VSS and a fully differential output stage 115 connected between a second voltage $VDD_{OUT}$ and VSS. For the following description, the common voltage VSS is assumed to be at a ground potential, although any value may be used, while $VDD_{IN}$ and $VDD_{OUT}$ are assumed to be at a higher potential. However, these assumptions are for convenience only and the present invention is not so limited. For the supply voltages $VDD_{IN}$ and $VDD_{OUT}$, $VDD_{IN}$ may either be less than, greater than or equal to $VDD_{OUT}$.

Transistors 104 and 106 form input inverter 105 coupled between $VDD_{IN}$ and VSS. As is known in the art, whatever voltage of an input signal provided to an input terminal A of inverter 105 is provided as an inverted signal at node AN having a corresponding voltage of either $VDD_{IN}$ or VSS. For the preferred embodiment described herein, transistor 104 may be, for example, a p-type field effect transistor (PFET) and transistor 106 may be, for example, an n-type field effect transistor (NFET).

Fully differential output stage 115 consists of a first stage formed from transistors 109 and 110 in parallel and having their sources coupled to the source voltage $VDD_{OUT}$ and their drains to the source of transistor 107 at node ZN; and a second stage formed from transistors 111 and 112 in parallel and having their sources coupled to the source voltage $VDD_{OUT}$ and their drains to the source of transistor 108 at node Z. Transistors 107 and 108 each have their other drain connected to the common voltage VSS. For the preferred embodiment described herein, transistors 107, 108, 109 and 111 may be NFETs, and transistors 110 and 112 may be PFETs.

While FIG. 1 illustrates the connection of transistors 107, 108, 109, 110 and 112 for the exemplary embodiment, as is known in the art, other transistors or other devices may be employed within the level shifting circuit to enhance reliable operation without effecting the operation of transistors 107–112. For example, a gating circuit may be employed across field effect transistors to prevent degradation due to excessive electric fields, which may be especially important if NFET devices are used for voltage pull-down. When such gating circuit devices are used for a transistor, the full voltage swing for the transistor is maintained, and such a circuit is described in U.S. Pat. No. 4,704,547 to Howard C. Hirsch.

The operation of the circuit of FIG. 1 is now described. An input signal, which may represent a logic level, may be applied to inverter 105 at node A, and this input signal is provided as an inverted signal at node AN. The signals at nodes A and AN are driven to a voltage potential of either VSS or to first voltage potential $VDD_{IN}$. The input signal at node A is also applied to the gate of transistors 107 and 111, while the inverted signal from node AN is provided to the gate of transistors 108 and 109.

Transistors 111 and 108 operating together act as an inverter coupled between $VDD_{OUT}$ and VSS when transistors 111 and 108 are driven by input signals applied to their respective gates which have opposite polarity. Consequently, this inverting pair is responsive to the signal applied to the gate of transistor 108 from the inverting node AN and to the signal applied to the gate of transistor 111 from the input node A. Transistor 112 acts as a pull-up transistor to force the voltage potential at node Z to be driven to $VDD_{OUT}$. The device size of transistor 112 is preferably smaller than the device size of transistors 108 and 111 in order not to interfere with the signal switching operation of transistors 108 and 111. Consequently, the signal applied to the gate of transistor 108 from the inverting node AN with a voltage potential of either $VDD_{IN}$ or VSS is respectively provided as an inverted signal at node Z with a voltage potential of either VSS or $VDD_{OUT}$.

For example, the signal at node A may be a logic level at ground potential VSS, and the inverted signal of node AN is the inverted logic level at source potential $VDD_{IN}$. Since the signal at node AN is applied to the gate of transistor 108, transistor 108 is on, transistor 111 is off and the signal at node Z is pulled down to ground potential VSS. When the input signal of node A switches to a logic level at source potential $VDD_{IN}$, the signal at node AN transitions and the operation of inverter 105 causes the signal at node AN to be pulled to ground potential VSS.

When the signal at node AN is driven to VSS and applied to the gate of transistor 108, the signal at input node A, which is at source potential $VDD_{IN}$, is applied to the gate of transistor 111. Transistor 108 is now off and transistor 111 is now on, and the operation of transistors 111 and 108 causes a relatively fast transition of the signal level at node Z from the ground potential VSS to an intermediate voltage.

Transistors 109 and 107 are coupled between $VDD_{OUT}$ and VSS, and are also driven from opposite polarity; consequently, transistors 109 and 107 also act as an inverting pair responsive to the signal applied to the gate of transistor 109 from the inverting node AN and to the signal applied to the gate of transistor 107 from the input node A. Similarly, transistor 110 also acting as a pull-up transistor to force the voltage across transistor 107 to be driven to $VDD_{OUT}$. However, this section of the differential stage 115 operates in an opposite manner with respect to the previously described section since transistor 107 is controlled by the signal at input node A, rather than the inverted signal at node AN, while operation of transistor 109 is controlled by the inverted signal provided from node AN to its gate. Consequently, as the signal appearing at node Z is driven to the intermediate voltage, the signal at node ZN is concurrently pulled down to the ground potential VSS.

Transistor pair 107 and 109 and transistor pair 108 and 111 are chosen such that rapid switching of the transistor between on and off occurs, which may be accomplished for example, by choosing NFET devices having a relatively short channel length. The preferred embodiment of the present invention also includes pull-up transistors 110 and 112, which may be chosen as PFET devices having relatively long channel lengths, and therefore, relatively high conductivity, so as to not interfere with the switching operation of transistor pair 107 and 109 or transistor pair 108 and 111.

For the exemplary embodiment, and as would be apparent to one skilled in the art, NFET transistors 107, 108, 109 and 111 of FIG. 1 require a source voltage to drop below the gate voltage to turn the transistor on. PFET transistors 110 and 112 operate with the same effect but with opposite polarity, requiring the source voltage to be above the gate voltage to turn the transistor on. Also, when a transistor is turned on, there is a source to gate voltage, called a threshold voltage or $V_{THRESHOLD}$, that the input signal to the transistor gate must overcome before switching the transistor on. Consequently, when transistor 109, or 111 is on, the intermediate voltage reached at node Z (and similarly with node ZN) is now roughly equivalent to ($VDD_{OUT}$) or ($VDD_{IN}$-$V_{THRESHOLD}$), which ever is the lower voltage. However, the preferred embodiment of the present invention includes pull-up transistors 110 and 112 whose operation is of opposite polarity to the operation of transistors 109 and 111. If transistor 110, or 112, is on at the same time the respective transistor 109, or 111, is on, the voltage at node Z, or ZN, is pulled-up to the voltage $VDD_{OUT}$ because transistors 110 and 112 now dominate operation. Therefore, transistors 109, or 111, pull-up the voltage at node Z, or ZN, to the intermediate voltage, and are switched off when the voltage reaches ($VDD_{IN}$ -$V_{THRESHOLD}$).

Returning to the operation of FIG. 1, the signal at node ZN is provided to the gate of transistor 112. As the signal at node ZN is pulled to ground potential VSS, the transistor 112, being a PFET in the preferred exemplary embodiment, is turned on, causing the signal at node Z to be pulled up to the source potential $VDD_{OUT}$. Interaction of PFET transistors 110 and 112 with NFET transistors 109 and 111, respectively, reduces DC current flow of the differential stage 115 to a minimum (approximately zero).

Although the circuit in FIG. 1 provides a non-inverted signal, shown in FIG. 1 as Output$_1$ at node Z, there is also an internal node ZN which may be used to is provide an inverted signal Output$_2$. However, the rise and fall times of resulting signal pulses of the inverted signal Output$_2$ at node ZN are not as balanced as the rise and fall times of the resulting signal pulses of the inverted signal Output$_1$ at node Z. As would be readily apparent to one skilled in the art, the imbalance of the non-inverting node ZN is a result of asymmetry in the number of gate delays through which the input signal must pass.

For connecting circuits using a level shifter 100 to transfer clock and control signals, an exemplary embodiment of level shifter 100 employs a preferred operating range in which the output to input voltage potential ratio ($VDD_{OUT}$/$VDD_{in}$) satisfies $0.5 \leq (VDD_{out}/VDD_{in}) \leq 2$. For higher ratios, for example, $(VDD_{out}/VDD_{in}) \leq 4$, the level shifter 100 may still be preferred for transferring control signals, but under some temperature and processing conditions, there may be a significant imbalance between rise and fall delay times in which the exemplary embodiment would not be preferred for transferring clock signals. This imbalance may be caused by, for example, the longer time required to charge a capacitance of the circuit driving the output signal having a large output voltage swing.

Also, for the exemplary embodiment described with reference to FIG. 1 employing NFETs and PFETs, the device sizes for these transistors are typically dependent on technology used and an intended load of the circuit. However, for the preferred embodiment, the device sizes of transistors 109, 107, 111 and 108 are typically comparable in size to those of an inverter driving a similar load. Consequently, device sizes of transistors 104 and 106 may be smaller by a factor of 2 or 3 than the device sizes of transistors 107, 108, 109 and 111.

Figure 2:
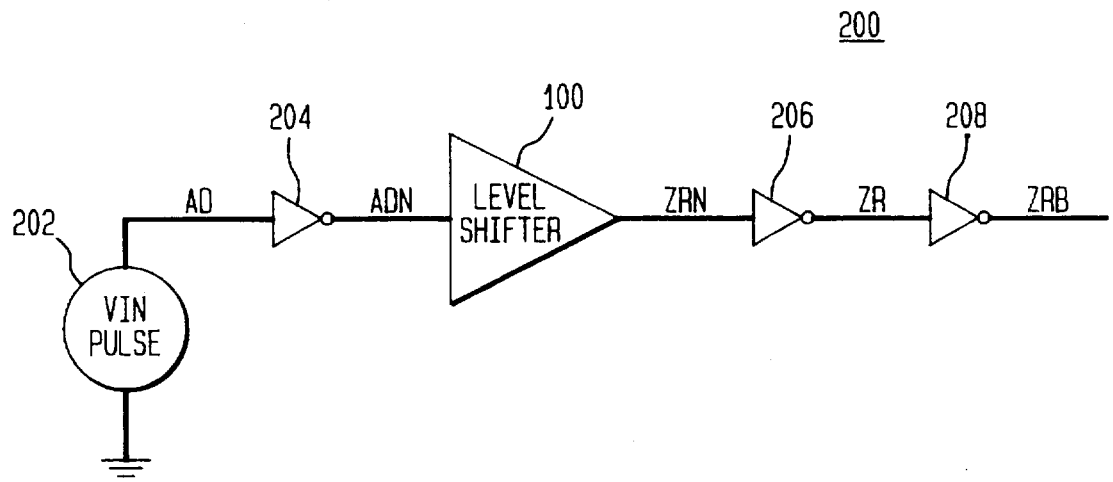
FIG. 2 is a diagram illustrating a simulation test circuit suitable for use with the exemplary embodiment of the present invention of FIG. 1.

FIG. 2 is a diagram illustrating a simulation test circuit 200 suitable for use with the exemplary embodiment of the present invention of FIG. 1. As shown, the exemplary test circuit includes an input source 202, inverters 204, 206 and 208, and level shifter circuit 100. The test circuit may be employed to simulate performance of the exemplary circuit of FIG. 1 which employs an 0.5 μm CMOS process for fast and slow operating conditions. The simulation input source 202 provides a square wave with 2 ns rise and fall times, buffered by the inverter 204 which has a switching point near VDD/2. Because the shape of the waveform coming directly out of the level shifter varies somewhat with supply voltage combinations, the simulation graphs, described subsequently with respect to FIGS. 3A–3C, illustrate the transit time from the level shifter input, through the level shifter and through one inverter 206 driven by the level shifter circuit 100.

Figure 3A:
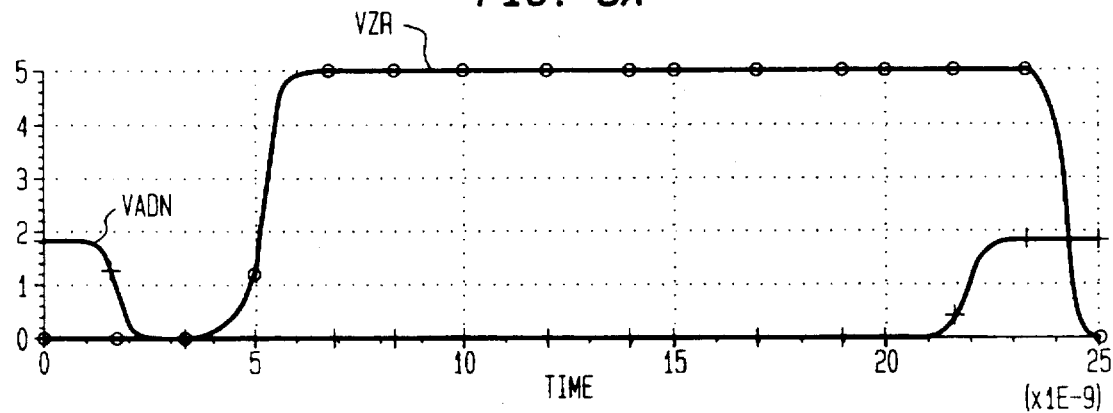
FIG. 3A illustrates signal rise and fall between a low voltage input signal and a level converted high voltage output signal of the exemplary embodiment of the present invention under a slow set of integrated circuit operating conditions and employing the simulation test circuit of FIG. 2.

FIG. 3A illustrates signal rise and fall between a low voltage input signal and a level converted high voltage output signal of the exemplary embodiment of the present invention under a slow set of operating conditions of an integrated circuit. A slow set of conditions are the manufacturing parameters and other physical conditions related to IC operation which cause a relatively long propagation time for a signal passing through a circuit, and for the slow set may include a high operating temperature of 125 degrees centigrade. The input signal $Lv_{IN}$ has a supply voltage potential of 1.8 Volts, and the output signal $Lv_{OUT}$ has a supply voltage potential of 5 Volts. $Lv_{IN}$ begins to transition at 1 ns and in response $Lv_{OUT}$ begins to transition at approximately 3.3 ns. $Lv_{OUT}$ is driven to the intermediate voltage potential of approximately 4.2 volts at 5.8 ns by the switching operation of NFET transistors 111 and 108 of FIG. 1, and then the voltage is driven to the supply voltage potential of 5 volts by 6 ns by operation of PFET 112.

Figure 3B:
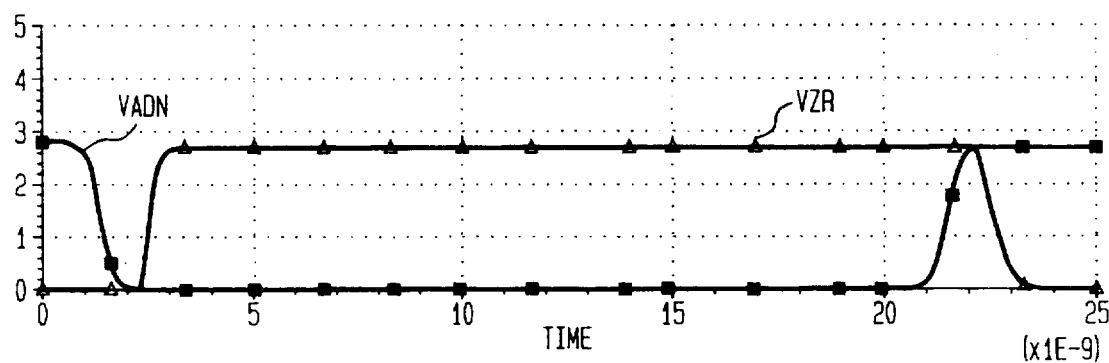
FIG. 3B illustrates signal rise and fall between an input signal and an output signal having the same voltage of the exemplary embodiment of the present invention under a slow set of integrated circuit operating conditions and employing the simulation test circuit of FIG. 2.

FIG. 3B similarly illustrates signal rise and fall between an input signal and an output signal having the same voltage of the exemplary embodiment of the present invention under the slow set of operating conditions. The input signal $Lv_{IN}$ has a supply voltage potential of 2.7 Volts, and the output signal $Lv_{OUT}$ has a supply voltage potential of 2.7 Volts. $Lv_{IN}$ begins to transition at 1 ns and in response $Lv_{OUT}$ begins to transition at approximately 2.3 ns. $Lv_{OUT}$ is driven to the intermediate voltage potential of approximately 2.5 volts at 2.6 ns by the switching operation of NFET transistors 111 and 108 of FIG. 1, and then the voltage is driven to the supply voltage potential of 2.7 volts by 3 ns by operation of PFET 112.

Figure 3C:
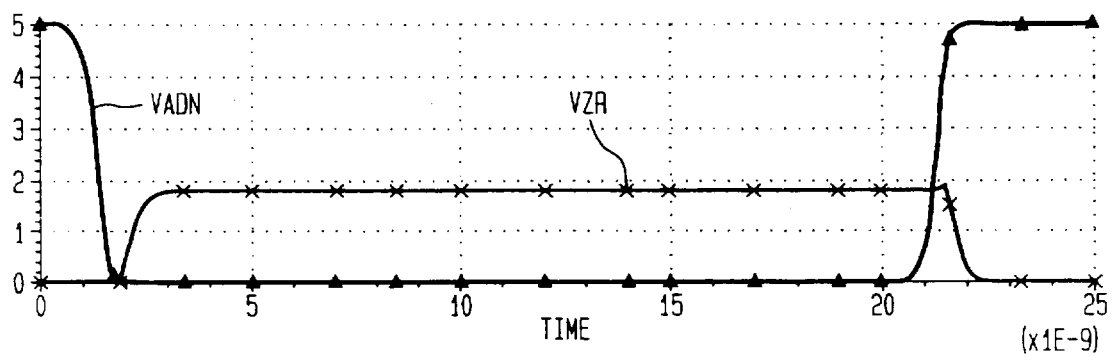
FIG. 3C illustrates signal rise and fall between a high voltage input signal and a level converted low voltage output signal of the exemplary embodiment of the present invention under a slow set of integrated circuit operating conditions and employing the simulation test circuit of FIG. 2.

FIG. 3C illustrates signal rise and fall between a high voltage input signal and a level converted low voltage output signal of the exemplary embodiment of the present invention under the slow set of operating conditions. The input signal $Lv_{IN}$ has a supply voltage potential of 5.0 Volts, and the output signal $Lv_{OUT}$ has a supply voltage potential of 1.8 Volts. $Lv_{IN}$ begins to transition at 0.8 ns and in response $Lv_{OUT}$ begins to transition at approximately 1.9 ns. $Lv_{OUT}$ is driven to the intermediate voltage potential of approximately 1.6 volts at 2.5 ns by the switching operation of NFET transistors 111 and 108 of FIG. 1, and then the voltage is driven to the supply voltage potential of 1.8 volts by 3 ns by operation of PFET 112.

Figure 4:
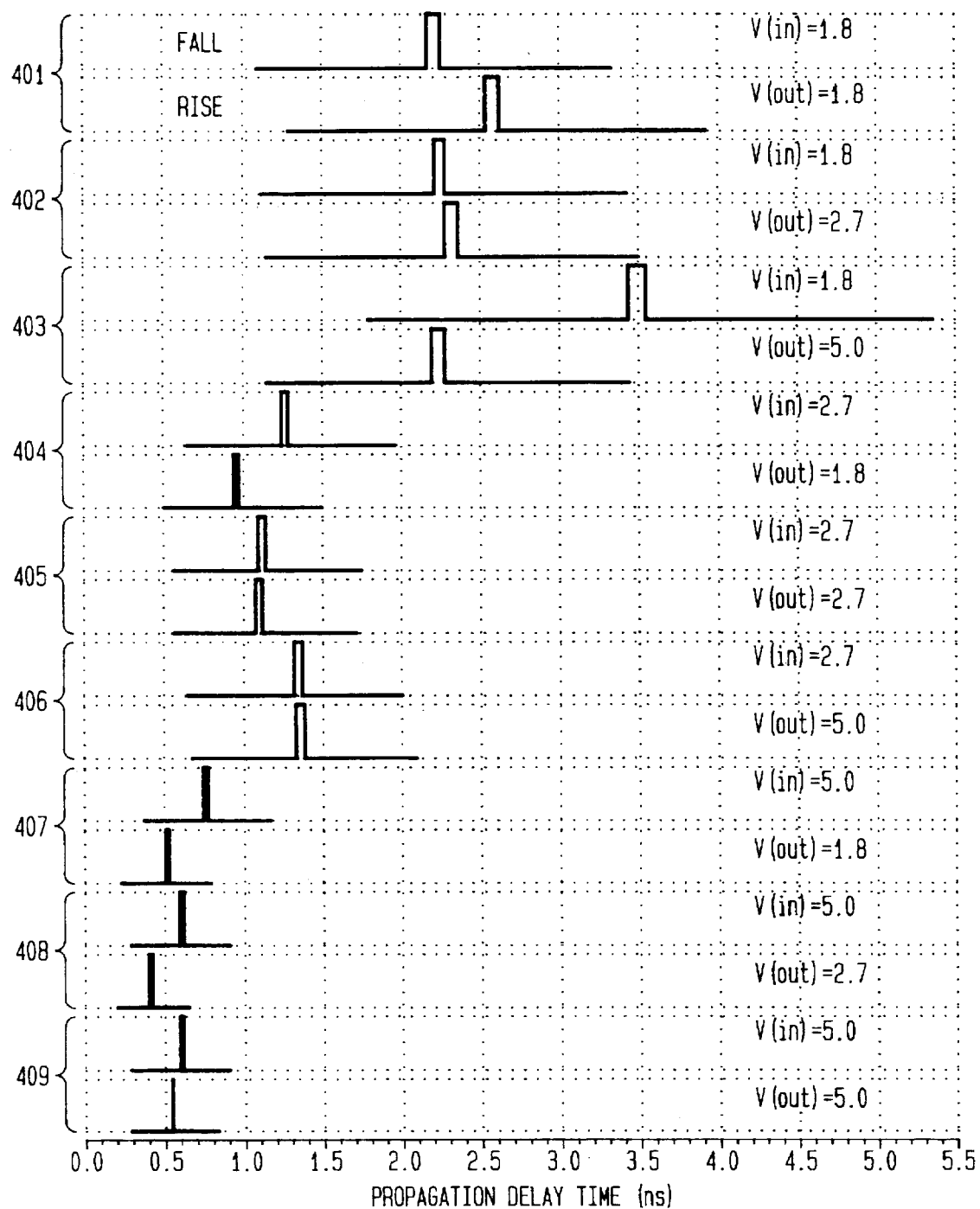
FIG. 4 illustrates propagation delay between rise and fall of input and output signals for various supply voltage combinations employed with the exemplary embodiment of the present invention under a set of integrated circuit operating conditions and employing the simulation test circuit of FIG. 2.

FIG. 4 illustrates propagation delay between rise and fall of input and output signals for various supply voltage combinations employed with the exemplary embodiment of the present invention under the slow set of operating conditions. FIG. 4 shows rise and fall sets 401 through 409 which illustrate the effect of supply voltage difference between input and output signals. The rise and fall times are measured from the $VDD_{in}/2$ level of the input signal appearing at node ADN of FIG. 2, which is the signal applied to node A of the level shifter circuit 100 of FIG. 1, to the $VDD_{out}/2$ level of the output signal appearing at node ZRN.

As shown in FIG. 4, when an output to input supply voltage ratio $V_{OUT}/V_{IN}$ is large (2.78), such as fall and rise set 403, the propagation delay is relatively long (1.15 ns) between input and output pulse transitions. In contrast, with the input and output supply voltage levels reversed so that the output to input supply voltage ratio $V_{OUT}/V_{IN}$ is small (0.36), as shown in fall and rise set 407, the propagation delay is relatively moderate (0.25 ns). Also, when the level shifter circuit 100 includes equivalent input and output supply voltages so that $V_{OUT}/V_{IN}$ is 1, the propagation delay is relatively small, as shown in rise and fall sets 401, 405 and 409, with the propagation delay between fall and rise pulses decreasing with increasing supply voltage.

Figure 5A:
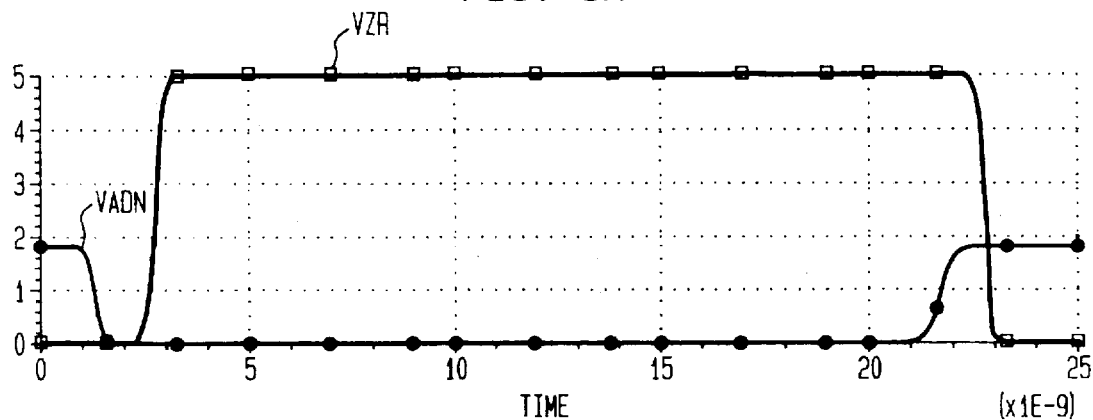
FIG. 5A illustrates signal rise and fall between a low voltage input signal and a level converted high voltage output signal of the exemplary embodiment of the present invention under a fast set of integrated circuit operating conditions and employing the simulation test circuit of FIG. 2.
Figure 5B:
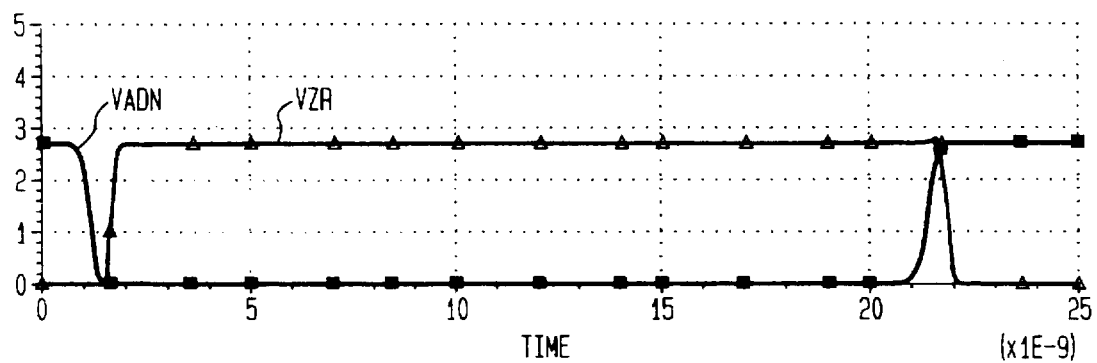
FIG. 5B illustrates signal rise and fall between an input signal and an output signal having the same voltage of the exemplary embodiment of the present invention under a fast set of integrated circuit operating conditions and employing the simulation test circuit of FIG. 2.
Figure 5C:
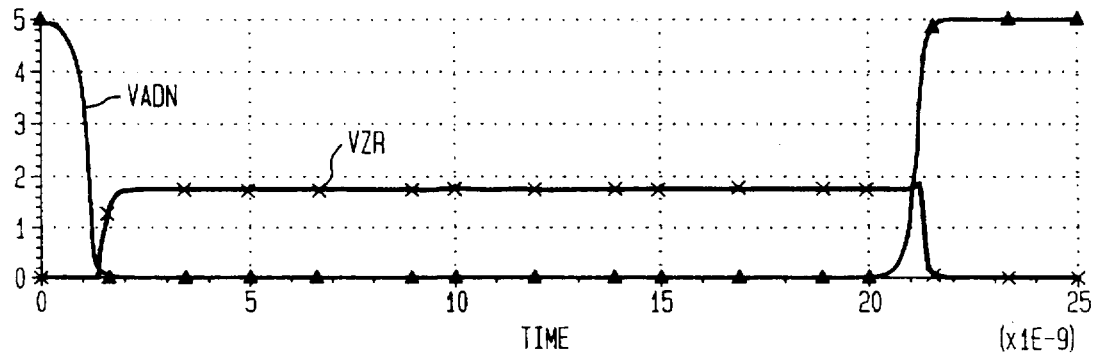
FIG. 5C illustrates signal rise and fall between a high voltage input signal and a level converted low voltage output signal of the exemplary embodiment of the present invention under a fast set of integrated circuit operating conditions and employing the simulation test circuit of FIG. 2.

FIGS. 5A through 5C illustrate signal rise and fall between (1) a low voltage input signal and a level converted high voltage output signal; (2) an input signal and an output signal having the same voltage; and (3) a high voltage input signal and a level converted low voltage output signal of the exemplary embodiment of the present invention under a fast set of operating conditions for an integrated circuit. For the fast set of operating conditions, the operating temperature is −40 degrees centigrade, and other manufacturing parameters are set for a relatively fast propagation time for a signal passing through a circuit. Similarly, FIG. 6 illustrates propagation delay between rise and fall of input and output signals for various supply voltage combinations, shown as fall and rise sets 601–609, employed with the exemplary embodiment of the present invention under the fast set of operating conditions and employing the test circuit of FIG. 2.

Figure 6:
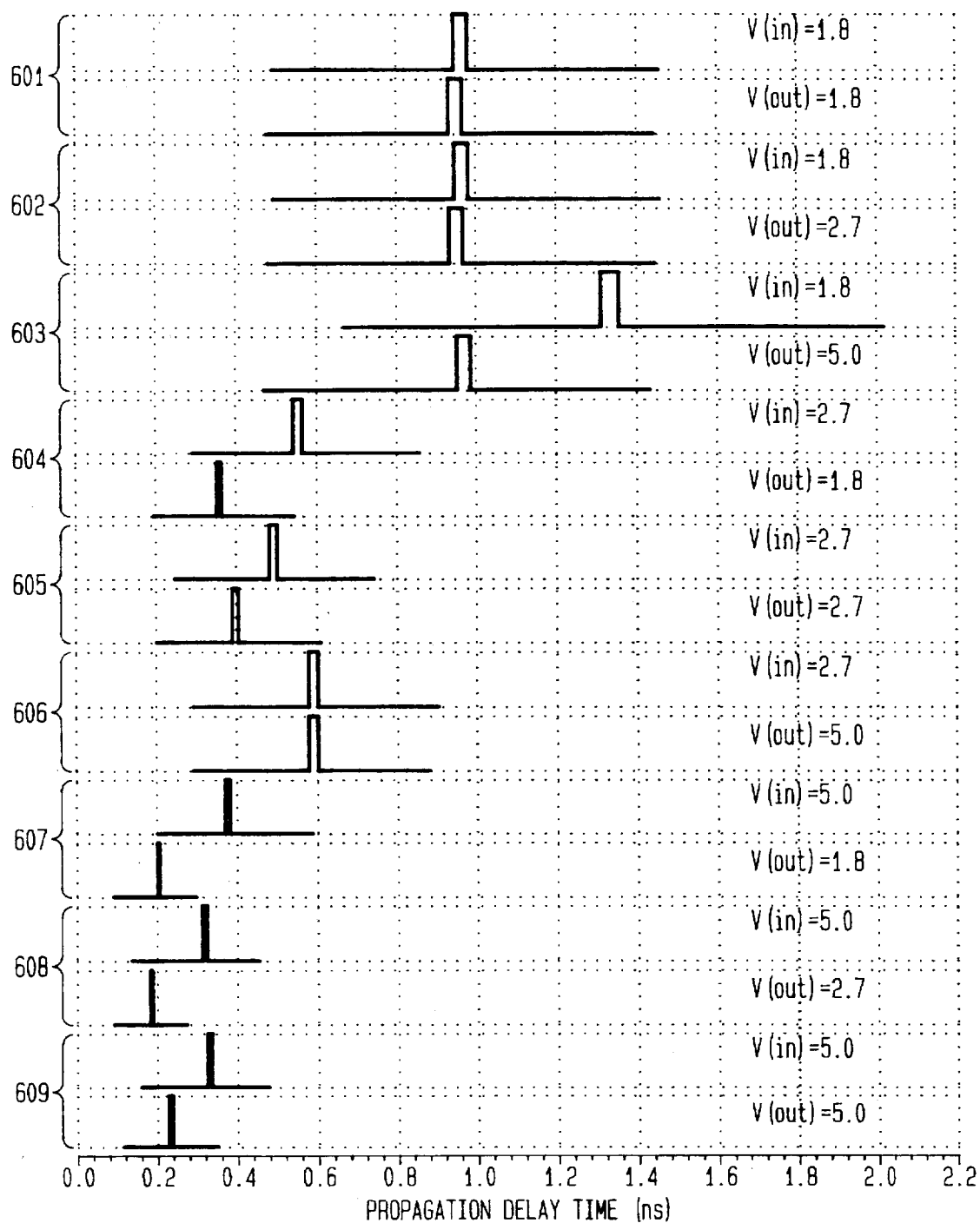
FIG. 6 illustrates propagation delay between rise and fall of input and output signals for various supply voltage combinations employed with the exemplary embodiment of the present invention under a fast set of integrated circuit operating conditions and employing the simulation test circuit of FIG. 2.

As shown in FIGS. 3A through 3C, FIG. 4, FIGS. 5A through 5C and in FIG. 6, operation of the level shifter circuit 100 may be satisfactory for many integrated circuit voltage level conversion applications when the level shifting circuit 100 is implemented in an IC operating under extreme conditions.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An integrated circuit including a level shifting circuit for converting an input signal varying between a first voltage level and a reference voltage and an output signal varying between a second voltage level and the reference voltage, comprising:

an inverter stage coupled across the first voltage level and the reference voltage, the inverter stage receiving at its input terminal the input signal and providing at an inverter output terminal an inverted input signal; and a differential stage including a first and a second section, each section having a first and a second transistor coupled in series between the second voltage level and the reference voltage, the first transistor coupled in parallel with a third transistor and the first, second and third transistor being coupled to a respective output node, the first and second transistors of the first section are respectively coupled to the inverter output terminal and input terminal to respectively receive the inverted input signal and the input signal, the first and second transistors of the second section are respectively coupled to the inverter input terminal and output terminal to respectively receive the input signal and the inverted input signal, and the third transistor of each section is coupled to the output node of the second and first section, wherein the third transistor of the second section, responsive to a signal at the output node of the first section, drives the first and second transistor of the second section so as to provide the output signal varying between the second voltage level and the reference voltage at the output node of the second section.

2. The level shifting circuit as recited in claim 1, wherein:

the inverter stage includes a p-channel transistor and an n-channel transistor, the inverter stage having a source of the p-channel transistor coupled to a terminal at the first voltage level, a drain of the p-channel transistor coupled to a source of the n-channel transistor, a gate of the p-channel transistor and a gate of the n-channel transistor coupled to the input terminal, and a drain of the n-channel transistor coupled to a terminal at the reference voltage.

3. The level shifting circuit as recited in claim 1, wherein the first and the second transistor of each section is an n-channel transistor and the third transistor is a p-channel transistor, and:

a source of the first and of the third transistor each being coupled to a terminal at the second voltage level, a drain of the first and of the third transistor and a source of the second transistor each being coupled to the output node, and the drain of second transistor being coupled to a terminal at the reference voltage; and a gate of the first transistor of the first section and a gate of the second transistor of the second section receiving the inverted input signal, a gate of the second transistor of the first section and a gate of the first transistor of the second section receiving the input signal, and, for each section, a gate of the third transistor of one section coupled to the output node of the other section.

4. The level shifting circuit as recited in claim 1, wherein:

the inverter stage includes a transistor pair having a p-channel transistor and an n-channel transistor, the transistor pair series coupled and having a source of the p-channel transistor coupled to a terminal at the first voltage level, a drain of the p-channel transistor coupled to a source of the n-channel transistor, a gate of the p-channel transistor and a gate of the n-channel transistor coupled to the input terminal, and a drain of the n-channel transistor coupled to a terminal at the reference voltage; and the first and the second transistor of each section is an n-channel transistor, and the third transistor of each section is a p-channel transistor, and each section of the differential stage includes:

a source of the first and of the third transistor each being coupled to a terminal at the second voltage level, a drain of the first and of the third transistor and a source of the second transistor each being coupled to the output node, and the drain of second transistor being coupled to the terminal at the reference voltage, and a gate of the first transistor of the first section and a gate of the second transistor of the second section receiving the inverted input signal, a gate of the second transistor of the first section and a gate of the first transistor of the second section receiving the input signal, and, for each section, a gate of the third transistor of one section coupled to the output node of the other section.

5. The level shifting circuit as recited in claim 4, wherein each p-channel transistor is a p-type field effect transistor (PFET) and each n-type transistor is an n-type field effect transistor (NFET).

6. The level shifting circuit as recited in claim 4, wherein a device size of the first and the second transistor of each section is at least twice a device size of the p-channel transistor of the transistor pair and at least twice a device size of the n-channel transistor of the transistor pair.

7. The level shifting circuit as recited in claim 4, wherein a channel length of the third transistor of each section is longer than a channel length of each of the first and the second transistor.

8. The level shifting circuit as recited in claim 4, wherein a ratio formed by the second voltage level divided by the first voltage level is within a range determined by a maximum imbalance value between a rise and a fall time between the input signal and the output signal.

9. The level shifting circuit as recited in claim 4, wherein the range of the ratio is between 0.5 and 2.

10. A method of converting, between circuits implemented in an integrated circuit, an input signal varying between a first voltage level and a reference voltage to an output signal varying between a second voltage level and the reference voltage, comprising the steps of:

a) inverting, by a first inverter coupled across the first voltage level and the reference voltage, the input signal provided at an input terminal to provide a first inverted input signal varying between the first voltage level and the reference voltage at an inverter node of the first inverter;

b) inverting, by a second inverter having a first and a second transistor coupled in series and coupled across a terminal at the second voltage level and the reference voltage, the input signal to provide a second inverted signal varying between an intermediate voltage level and the reference voltage at an inverted output node at a connection of the first and the second transistor, the first and the second transistor coupled to the inverter node and input terminal respectively;

c) inverting, by a third inverter coupled between the terminal at the second voltage level and the reference voltage and having a third and a fourth transistor in series, the third transistor having a threshold voltage and coupled between the terminal at the second voltage level and an output node, the first inverted input signal to provide an intermediate output signal varying between the intermediate voltage level and the reference voltage at the output node at a connection of the third and the fourth transistor, the fourth and the third transistor coupled to the inverter node and input terminal respectively; and d) driving, by a pull-up transistor coupled across the terminal at second voltage level and the output node of the second inverter and coupled to the inverted output node, the pull-up transistor operating in a similar manner but of opposite polarity to the third transistor and having a threshold voltage tending to cancel the threshold voltage of the third transistor, the intermediate output signal varying between the intermediate voltage level and the reference voltage such that the output signal varies between the second voltage level and the reference voltage at the output node of the second inverter.

11. The method of converting the input signal to an output signal as recited in claim 10, wherein the pull-up transistor is a p-type field effect transistor (PFET) and the first, second, third and fourth transistor is an n-type field effect transistor (NFET).

12. The method of converting the input signal to an output signal as recited in claim 11, wherein a channel length of the pull-up transistor is longer than a channel length of each of the first, second, third and fourth transistor.

13. The method of converting the input signal to an output signal as recited in claim 11, wherein a ratio formed by the second voltage level divided by the first voltage level is within a range determined by a maximum imbalance value between a rise and a fall time between the input signal and the output signal.

* * * * *